US012051563B2

United States Patent
Komatsuzaki et al.

(10) Patent No.: US 12,051,563 B2
(45) Date of Patent: Jul. 30, 2024

(54) CHARGED PARTICLE BEAM DEVICE

(71) Applicant: Hitachi High-Tech Corporation, Tokyo (JP)

(72) Inventors: Ryo Komatsuzaki, Tokyo (JP); Hiroyuki Chiba, Tokyo (JP); Wei Chean Tan, Tokyo (JP); Hirofumi Satou, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 373 days.

(21) Appl. No.: 17/637,328

(22) PCT Filed: Sep. 4, 2019

(86) PCT No.: PCT/JP2019/034838
§ 371 (c)(1),
(2) Date: Feb. 22, 2022

(87) PCT Pub. No.: WO2021/044553
PCT Pub. Date: Mar. 11, 2021

(65) Prior Publication Data
US 2022/0301813 A1 Sep. 22, 2022

(51) Int. Cl.
*H01J 37/24* (2006.01)
*H01J 37/244* (2006.01)
*H01J 37/28* (2006.01)

(52) U.S. Cl.
CPC ............ *H01J 37/244* (2013.01); *H01J 37/28* (2013.01); *H01J 2237/2448* (2013.01)

(58) Field of Classification Search
CPC ....... H01J 37/244; H01J 37/28; H01J 37/2448
See application file for complete search history.

(56) References Cited

U.S. PATENT DOCUMENTS

| 7,113,628 B1 | 9/2006 | Obara et al. |
| 2004/0126909 A1 | 7/2004 | Obara et al. |

(Continued)

FOREIGN PATENT DOCUMENTS

| CN | 110168696 A | 8/2019 |
| JP | 2001-156135 A | 6/2001 |

(Continued)

OTHER PUBLICATIONS

International Search Report (PCT/ISA/210) issued in PCT Application No. PCT/JP2019/034838 dated Dec. 3, 2019 with English translation (five (5) pages).

(Continued)

*Primary Examiner* — Nicole M Ippolito
(74) *Attorney, Agent, or Firm* — Crowell & Moring LLP

(57) ABSTRACT

A charged particle beam device 100 includes an irradiation unit 110 configured to irradiate a sample S with a charged particle beam, a detection unit 130 configured to output a signal caused by irradiating the sample S with the charged particle beam, a display unit 154 configured to output a condition selection interface for selecting one condition set from a plurality of condition sets, and a control unit 151 configured to execute an evaluation on an object of interest. The condition set includes information for specifying one learned model from a plurality of learned models, information for specifying one search condition from a plurality of search conditions including at least one of an irradiation condition and a detection condition, and information for specifying one analysis condition from a plurality of analysis conditions defining an operation of at least one of the irradiation unit 110 and the detection unit 130. The charged particle beam device 100 is configured to accept a selection of the condition set via the condition selection interface, irradiate a first region of the sample S with the charged (Continued)

particle beam based on the specified search condition and detect a first signal caused by the irradiation, transfer information that is based on the first signal to the specified learned model, acquire information that represents a second region of the sample S including a position of a candidate of the object of interest from the specified learned model, the second region being a part of the first region and smaller than the first region, irradiate the second region with the charged particle beam based on the specified analysis condition and detect a second signal caused by the irradiation, and input information that is based on the second signal to the control unit 151.

3 Claims, 11 Drawing Sheets

(56) References Cited

U.S. PATENT DOCUMENTS

| | | |
|---|---|---|
| 2006/0274933 A1 | 12/2006 | Obara et al. |
| 2013/0112893 A1 | 5/2013 | Miyake et al. |
| 2016/0163035 A1 | 6/2016 | Chang et al. |
| 2018/0240225 A1 | 8/2018 | Harada et al. |
| 2020/0111638 A1 | 4/2020 | Araki et al. |
| 2020/0278303 A1 | 9/2020 | Tada et al. |
| 2021/0090853 A1* | 3/2021 | Aso .................. H01J 37/28 |
| 2022/0140886 A1* | 5/2022 | Lau .................. H04B 7/088 375/267 |
| 2023/0035039 A1* | 2/2023 | Hirose .............. G06V 20/693 |

FOREIGN PATENT DOCUMENTS

| | | |
|---|---|---|
| JP | 2004-191187 A | 7/2004 |
| JP | 2012-22904 A | 2/2012 |
| JP | 2018-506168 A | 3/2018 |
| JP | 2018-137275 A | 8/2018 |
| JP | 2019-60741 A | 4/2019 |

OTHER PUBLICATIONS

Japanese-language Written Opinion (PCT/ISA/237) issued in PCT Application No. PCT/JP2019/034838 dated Dec. 3, 2019 (five (5) pages).
Chinese-language Office Action issued in Chinese Application No. 201980099623.X dated Feb. 8, 2024 (7 pages).

* cited by examiner

[FIG. 1]
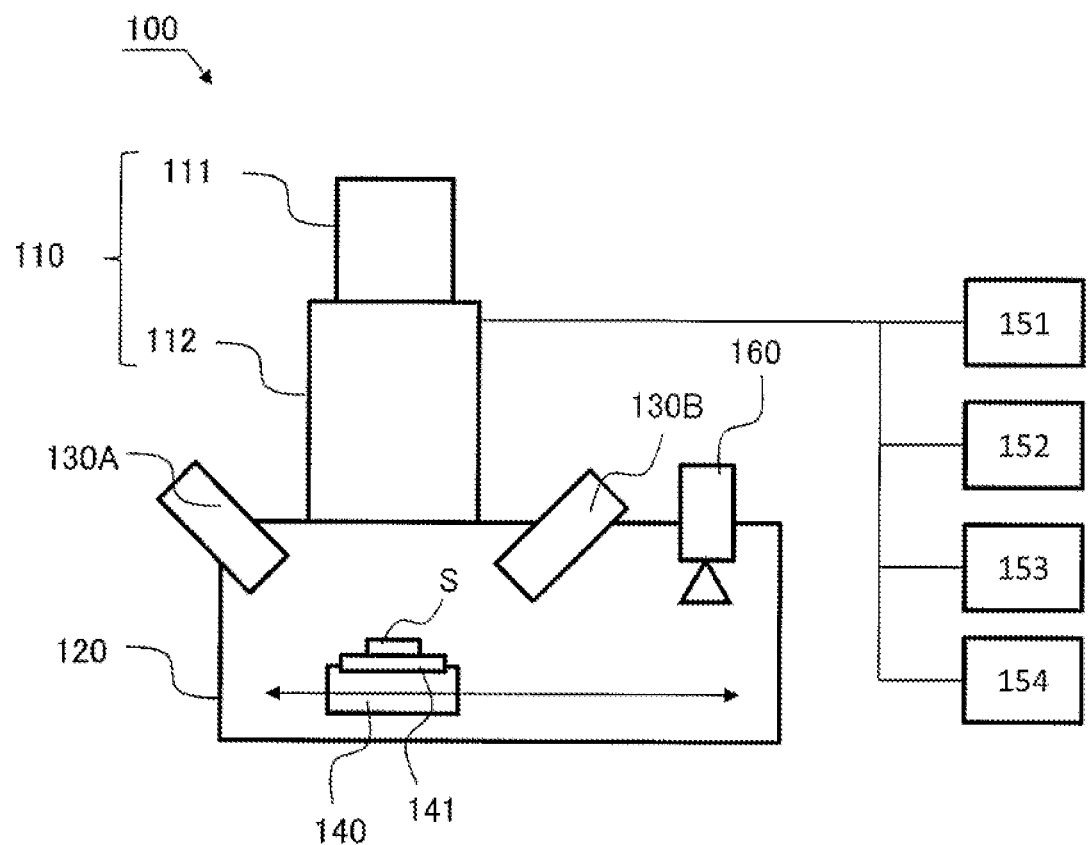

[FIG. 2]
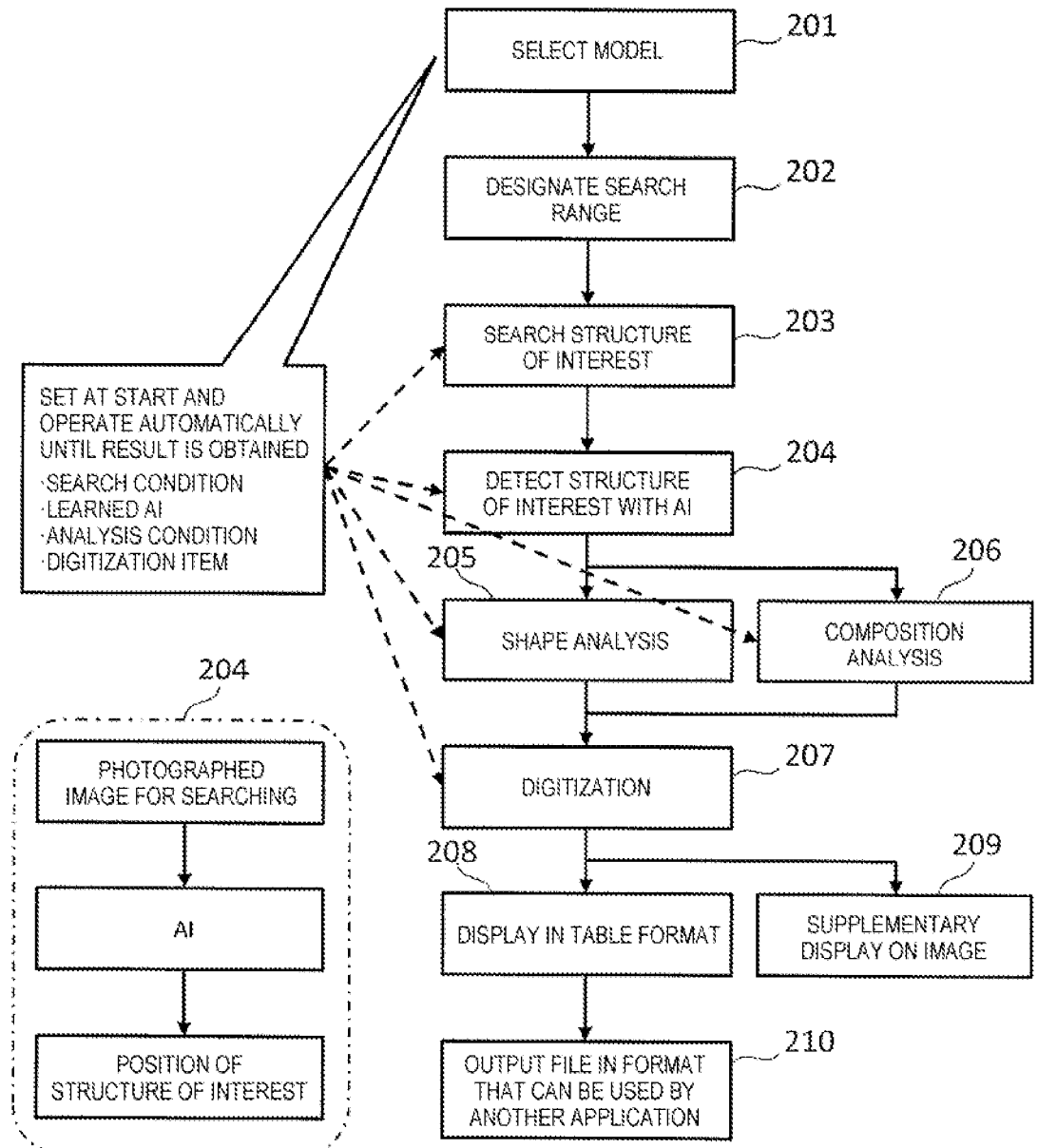

[FIG. 3]
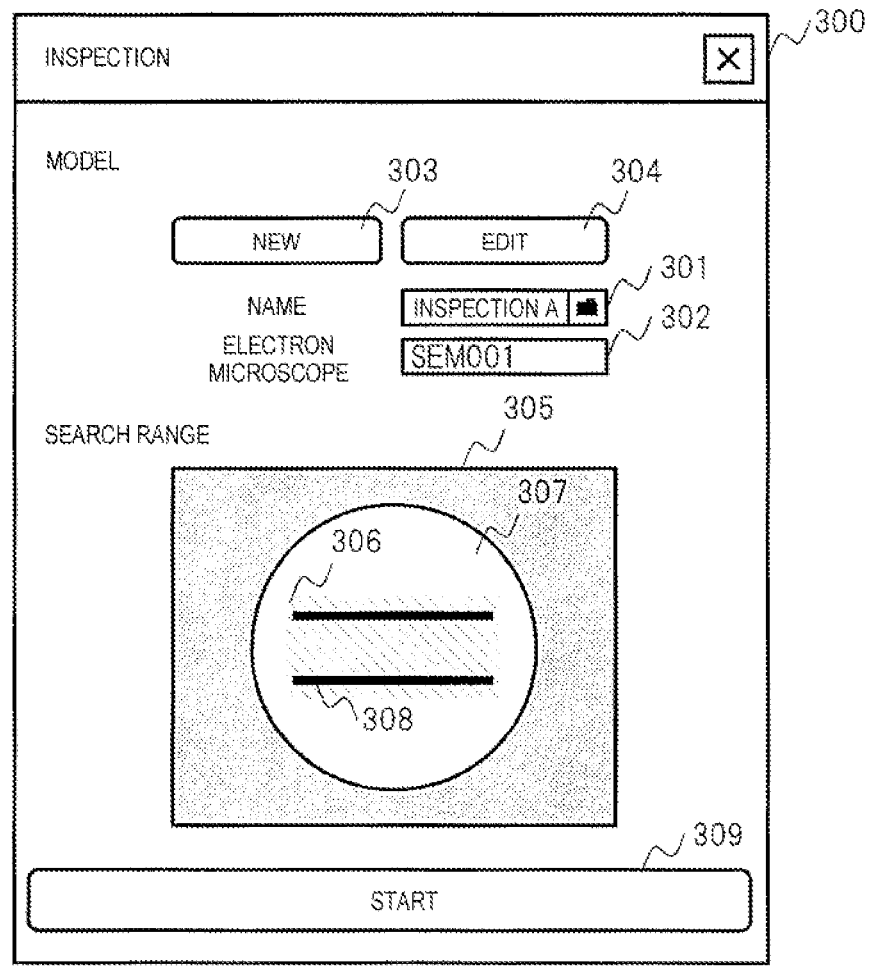
[FIG. 4]
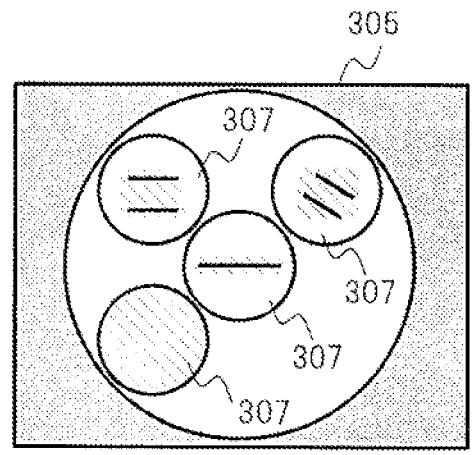

[FIG. 5]
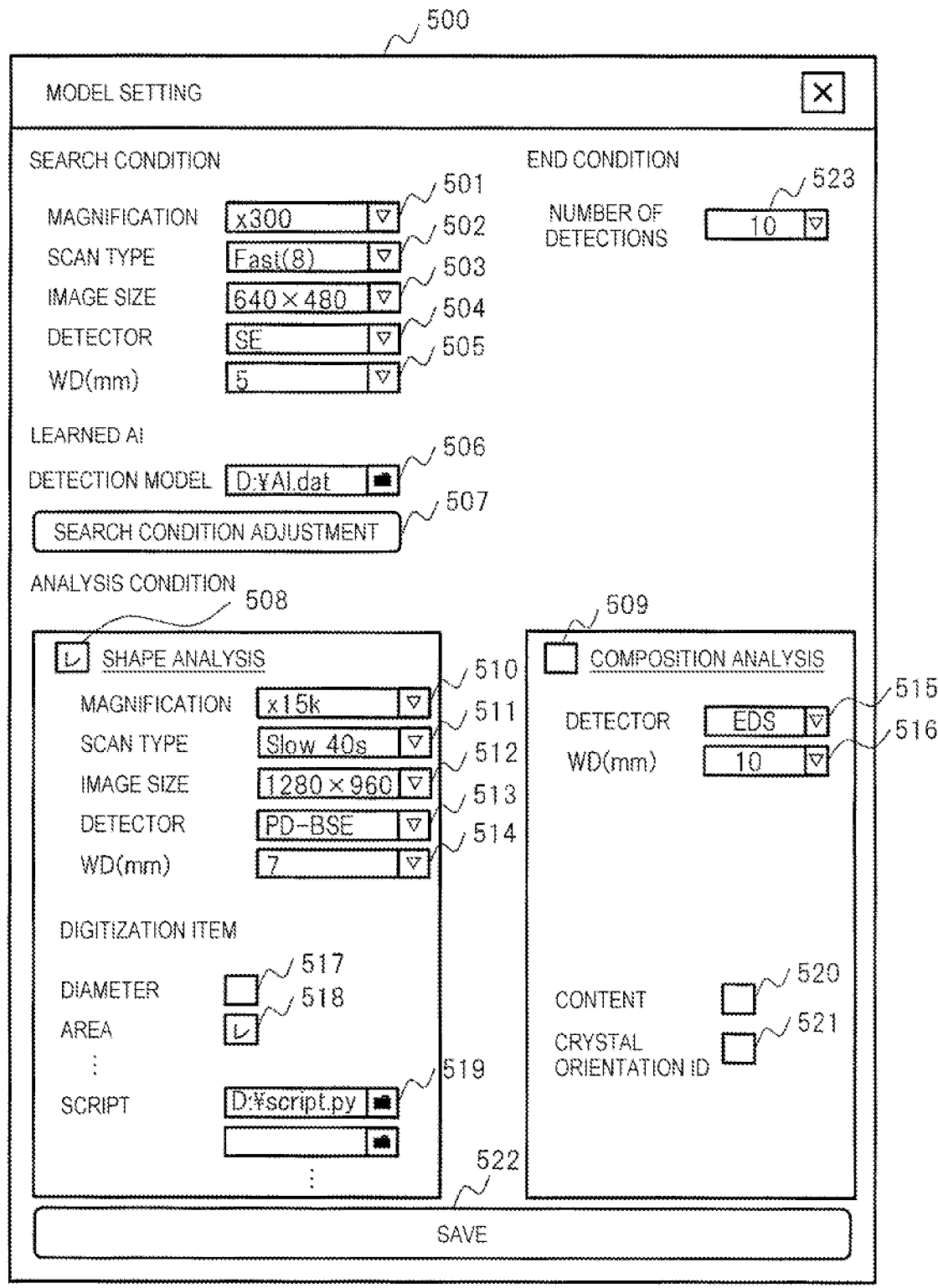

[FIG. 7]
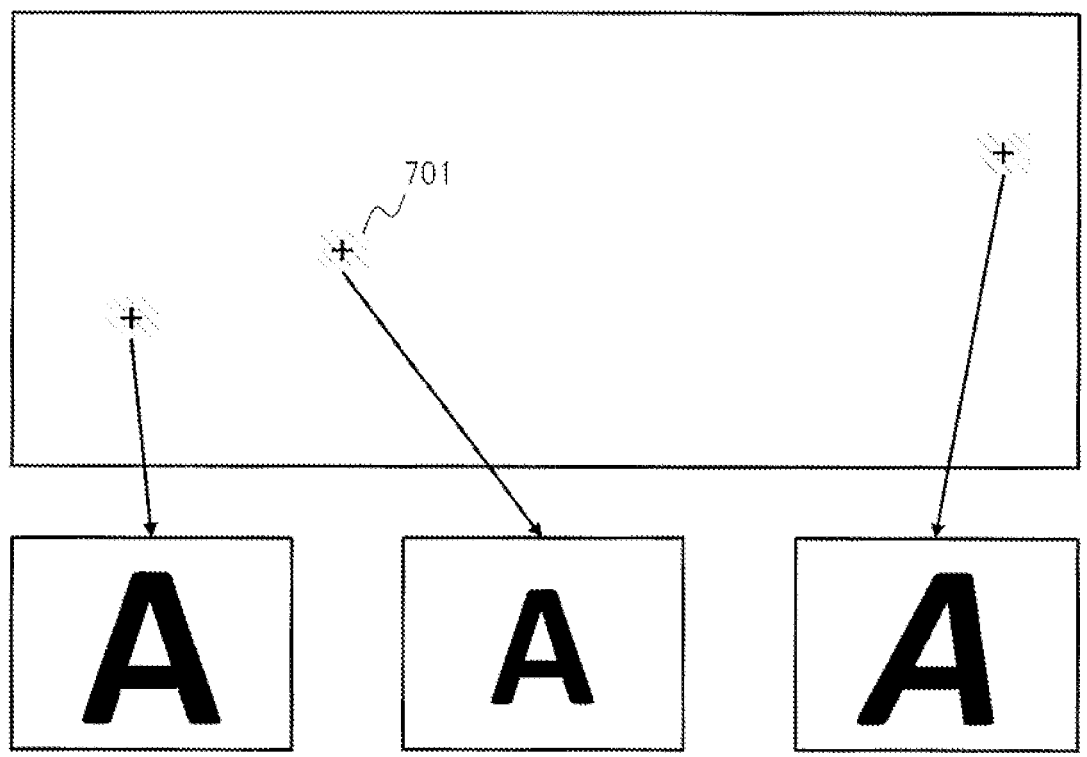

[FIG. 8]
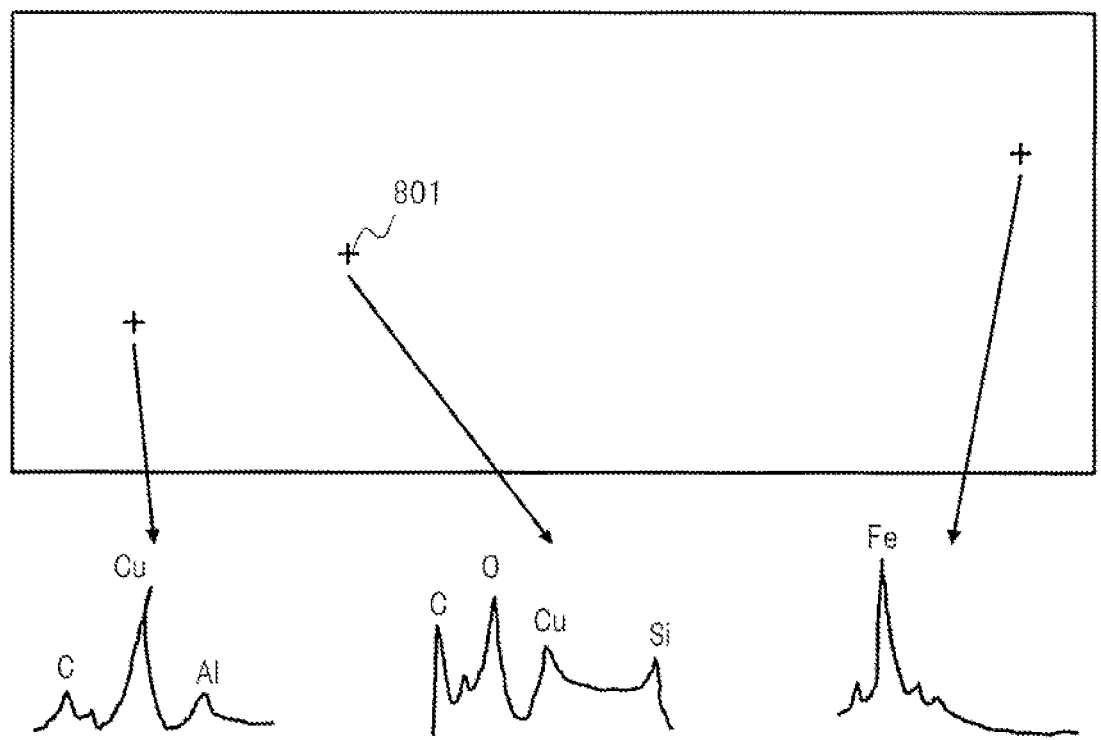

[FIG. 11]

CHARGED PARTICLE BEAM DEVICE

TECHNICAL FIELD

The present invention relates to a charged particle beam device.

BACKGROUND ART

In order to detect and/or evaluate an object of interest in a sample, a charged particle beam device is used. The charged particle beam device irradiates the sample with a charged particle beam, and detects and/or evaluates the object of interest using a signal caused by the irradiation. An example of such a charged particle beam device is disclosed in PTL 1.

CITATION LIST

Patent Literature

PTL 1: JP-A-2019-60741

SUMMARY OF INVENTION

Technical Problem

However, in inspection work using the charged particle beam device, work of setting various conditions related to an operation of the charged particle beam device and work of setting an analysis region are manually performed, and therefore there is a problem that time and labor are required.

Since the object of interest is diverse and the charged particle beam device is expensive, the same charged particle beam device may have to be diverted to the objects of interest having different characteristics. Even in such a case, time and labor are required for performing an operation of setting the conditions and an operation of setting the analysis region.

The invention has been made to solve such a problem, and an object of the invention is to provide a charged particle beam device that automatically performs an operation of setting various conditions related to operations and an operation of setting an analysis region.

Solution to Problem

An example of a charged particle beam device according to the invention includes
an irradiation unit configured to irradiate a sample with a charged particle beam,
a detection unit configured to output a signal caused by irradiating the sample with the charged particle beam,
an interface output unit configured to output a condition selection interface for selecting one condition set from a plurality of condition sets, and
an evaluation unit configured to execute an evaluation on an object of interest.
The condition set includes
information for specifying one learned model from a plurality of learned models,
information for specifying one search condition from a plurality of search conditions including at least one of an irradiation condition and a detection condition, and
information for specifying one analysis condition from a plurality of analysis conditions defining an operation of at least one of the irradiation unit and the detection unit.

The charged particle beam device is configured to
accept a selection of the condition set via the condition selection interface,
irradiate a first region of the sample with the charged particle beam based on the specified search condition and detect a first signal caused by the irradiation,
transfer information that is based on the first signal to the specified learned model,
acquire information that represents a second region of the sample including a position of a candidate of the object of interest from the specified learned model, the second region being a part of the first region and smaller than the first region,
irradiate the second region with the charged particle beam based on the specified analysis condition and detect a second signal caused by the irradiation, and
input information that is based on the second signal to the evaluation unit.

According to the charged particle beam device according to the invention, it is not necessary to individually set various conditions, and it is possible to automatically set an analysis region.

BRIEF DESCRIPTION OF DRAWINGS

FIG. 1 is a front view schematically showing a charged particle beam device according to a first embodiment of the invention.

FIG. 2 is a flowchart showing operations of the charged particle beam device in FIG. 1.

FIG. 3 is an example of a screen constituting a part of a condition selection interface output in processing in FIG. 2.

FIG. 4 is another example of a navigation image in FIG. 3.

FIG. 5 is an example of a screen for setting a condition set.

FIG. 7 is a diagram schematically showing processing related to shape analysis.

FIG. 8 is a diagram schematically showing processing related to composition analysis.

DESCRIPTION OF EMBODIMENTS

Figure 6A:
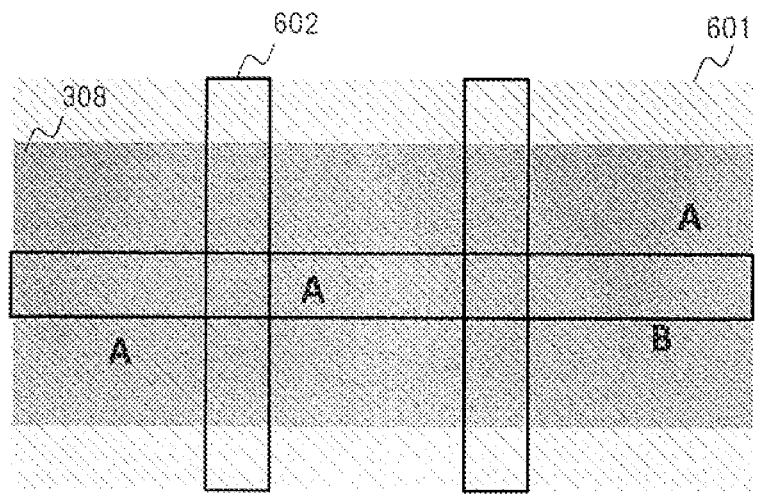
FIGS. 6A to 6C are examples of a second region.

Hereinafter, embodiments according to the invention will be described with reference to the accompanying drawings.

First Embodiment

<Configuration of Charged Particle Beam Device 100>

FIG. 1 is a front view schematically showing a charged particle beam device 100 according to a first embodiment. The charged particle beam device 100 is a scanning electron microscope. However, the charged particle beam device may be another charged particle beam device such as a transmission electron microscope or an ion beam device. It should be noted that a configuration of the charged particle beam device 100 is merely an example. In other words, a specific configuration of each part of the charged particle beam device 100 may vary depending on a type or structure of the charged particle beam device 100.

The charged particle beam device 100 includes an irradiation unit 110 that irradiates a sample S with a charged particle beam. The irradiation unit 110 in this example includes an electron source 111 and a lens barrel 112. The electron source 111 emits electrons serving as a source of the charged particle beam (in this example, an electron beam). The lens barrel 112 includes a focusing lens, a scanning coil, an objective lens, and the like, and guides the charged particle beam toward the sample S.

The irradiation unit 110 is connected to a sample chamber 120. Typically, the sample chamber 120 is evacuated by a vacuum pump (not shown) or the like.

In this example, a detection unit 130 that outputs a signal caused by irradiating the sample S with the charged particle beam is provided at the sample chamber 120. A target to be detected by the detection unit 130 may be secondary electrons, backscattered electrons, X-rays, Auger electrons, or the like. A plurality of detection units 130 may be provided. In this example, the charged particle beam device 100 includes a first detection unit 130A that detects the secondary electrons and a second detection unit 130B that detects the X-rays. The detection unit 130 is not necessarily provided at the sample chamber 120. As an example, in a type of scanning electron microscope, the detection unit 130 is provided inside the lens barrel 112. As another example, in a type of transmission electron microscope, the detection unit 130 is provided downstream of the sample S in a flow of an electron beam so as to detect the electron beam transmitted through the sample S.

The charged particle beam device 100 includes a stage 140. The stage 140 may be a movable stage. Typically, the stage 140 may be movable in an X direction and/or a Y direction (one direction in a plane perpendicular to an optical axis of the charged particle beam: an arrow direction in FIG. 1). Further, the stage 140 may be movable in a Z direction (a direction perpendicular to the optical axis of the charged particle beam). Further, the stage 140 may be rotatable (rotation with a Z-axis direction as a rotation axis). Further, the stage 140 may be tiltable (rotation with the X direction or the Y direction as a rotation axis). The stage 140 may be configured to support a sample holder 141. In this example, the sample S is placed on the sample holder 141.

The charged particle beam device 100 may be connected to a control unit 151, an input unit 152, a storage unit 153, and a display unit 154. The control unit 151, the input unit 152, the storage unit 153, and the display unit 154 may be a part of the charged particle beam device 100 or may be independent of the charged particle beam device 100. A connection between the respective units may be a wired connection or a wireless connection. Therefore, connection lines shown in FIG. 1 are merely an example. As an addition or alternative, a connection via a communication line such as Internet can also be adopted. For example, the storage unit 153 may be a storage unit 153 on an intranet, the Internet, or a cloud service. When the charged particle beam device 100 is connected to the control units 151 or the storage units 153 in a plurality of layers, the control unit 151 or the storage unit 153 in an upper layer may be referred to as an upper layer device.

In a typical charged particle beam device 100, the control unit 151 that receives a signal from the detection unit 130 can generate an image or a spectrum. Alternatively, the control unit 151 can evaluate a region of the sample S that is irradiated with the charged particle beam. Therefore, the control unit 151 may also be referred to as an "evaluation unit".

Although the term "region" refers to, for example, a surface having a finite spread in the present specification, the term "region" may also refer to a volume having a finite size, a line having a finite length and zero or substantially negligible width, or a point having zero or substantially negligible magnitude. In addition, in the present specification, the term "evaluation" refers to, for example, generating information related to a region or a part thereof based on the region or a part thereof, and includes an operation called "analysis" or "determination".

In the present embodiment, the control unit 151 can generate an SEM image (here, a secondary electron image) based on a signal output from the first detection unit 130A. Similarly, the control unit 151 can generate an X-ray analysis image or a spectrum based on a signal output from the second detection unit 130B. The control unit 151 can evaluate, for example, a surface shape or a surface element of the sample S based on these images or signals.

Input of information to the charged particle beam device 100 or output of information from the charged particle beam device 100 may be performed via a user interface (UI). In this example, the UI is a graphical user interface (GUI) and is displayed on the display unit 154.

In the control unit 151, control of the charged particle beam device 100, the generation of an image or a spectrum, or the evaluation of the sample S may be executed based on a learned model stored in the storage unit 153.

The control unit 151 may control operations of the entire charged particle beam device 100. The control unit 151 may implement this control by executing a program. This program may be stored in the storage unit 153 or may be stored in a storage unit in the control unit 151 independent of the storage unit 153.

The charged particle beam device 100 may further include a navigation image photographing device 160. The navigation image photographing device 160 performs photographing to obtain a navigation image 305 (described later). In an example of FIG. 1, the navigation image photographing device 160 is provided at the sample chamber 120. In FIG. 1, when the stage 140 is located at a right end of the arrow in FIG. 1, the navigation image photographing device 160 can photograph at least a part of a portion where the sample holder 141 is expected to be present. In the example of FIG. 1, the navigation image photographing device 160 is an optical camera, and can photograph all portions where the sample holder 141 is expected to be present. A light source used for the navigation image photographing device 160 may be provided at the sample chamber 120.

Unlike the example of FIG. 1, an image acquisition unit other than an optical camera may be used as the navigation image photographing device 160. In addition, unlike the example of FIG. 1, the navigation image photographing device 160 may be used independently of the charged particle beam device 100. For example, an optical microscope that is independent of the charged particle beam device 100 and that is capable of fixing the sample holder 141 at a fixed position and in a fixed direction may be used as the navigation image photographing device 160. The navigation image photographing device 160 may also be connected to the control unit 151, the input unit 152, the storage unit 153, and the display unit 154.

<Operation of Charged Particle Beam Device 100>

FIG. 2 is a flowchart showing operations of the charged particle beam device 100 according to the first embodiment. In processing of FIG. 2, first, the charged particle beam device 100 selects a model (step 201). In this step, the charged particle beam device 100 outputs an interface (condition selection interface) for selecting one condition set from a plurality of condition sets. The condition set includes a combination of conditions for specifying an operation of the charged particle beam device 100.

FIG. 3 shows an example of a screen constituting a part of the condition selection interface output in step 201. In the present embodiment, the condition selection interface is configured as a GUI. A screen 300 is output as a screen display on the display unit 154. That is, in the present embodiment, the display unit 154 functions as an interface output unit that outputs the condition selection interface.

In the example of FIG. 3, the condition selection interface includes a name field 301. In the present embodiment, the name field 301 is used to select one of the plurality of condition sets. For example, different names are associated with the respective condition sets, and when a name corresponding to a specific condition set is input, the condition set is selected.

The condition selection interface includes a device type field 302. The device type field 302 is used to input or display information specifying a type of the charged particle beam device to be used.

The condition selection interface includes a "NEW" button 303 and an "EDIT" button 304. The "NEW" button 303 is to be operated at the time of creating a new condition set, and the "EDIT" button 304 is to be operated at the time of changing content of an existing condition set.

The condition selection interface includes the navigation image 305. The navigation image 305 is an image for visually designating a search range in the sample S that is placed on a sample stage 307 (for example, corresponding to the sample holder 141 in FIG. 1) by a user, and is typically obtained by photographing of the navigation image photographing device 160. However, if an observation magnification of the charged particle beam device 100 can be set to be sufficiently low, an image such as an SEM image may be used as the navigation image 305. The navigation image 305 displays a search region 306 related to the sample. In FIG. 3, the search region 306 is indicated by hatching. In this example, two conductive tapes 308 are placed on the sample stage 307, and the search region 306 includes the entire conductive tapes 308.

FIG. 4 shows another example of the navigation image 305. In this example, a plurality of sample stages 307 are disposed, and different search regions are designated in the respective sample stages 307.

FIG. 5 shows an example of a screen for setting a condition set (including selection of a learned model). A screen 500 constitutes a part of the condition selection interface in the present embodiment, and, as a modified example, may be configured as a GUI of a screen different from the condition selection interface. The screen 500 is output when, for example, the "NEW" button 303 or the "EDIT" button 304 in FIG. 3 is operated.

According to FIG. 5, via the condition selection interface, an input of information related to a search condition, a learned AI (that is, a learned model generated by machine learning), an analysis condition, and a digitization item is accepted, or the input information is displayed.

The search condition is a condition including at least one of an irradiation condition (mainly an operation condition of the irradiation unit 110, and also including conditions such as a position and an inclination of the stage 140 (in other words, a position and an inclination of the sample S) and a degree of vacuum of the sample chamber 120) and a detection condition (mainly an operation condition of the detection unit 130, and also including conditions such as a structure (a diaphragm or the like) of a previous stage of the detection unit 130). The condition selection interface includes, regarding the search condition, a magnification selection portion 501 for specifying a magnification, a scan type selection portion 502 for specifying a type of scan, an image size selection portion 503 for specifying an image size, a detector selection portion 504 for specifying a detector, and a WD selection portion 505 for specifying a working distance.

As the type of scan, a scan speed (including a case where the speed is 0), a scan path (raster scan, snake scan, or the like), the number of integrated scans for the same region, a scan integration method (for each line, for each image, or the like), or a combination thereof can be selected.

As the detector, a secondary electron detector, a backscattered electron detector, an X-ray detector, an Auger electron detector, a transmitted electron detector (for example, a camera), a detector for specifying a crystal orientation, or the like can be selected.

The condition selection interface includes a learned model field 506 and a "SEARCH CONDITION ADJUSTMENT" button 507. The learned model field 506 is used to specify one learned model from a plurality of learned models. The "SEARCH CONDITION ADJUSTMENT" button 507 will be described later.

The analysis condition is a condition defining an operation of at least one of the irradiation unit 110 and the detection unit 130. The analysis condition may or may not include an item overlapping that of the above search condition. The condition selection interface includes, regarding the analysis condition, a shape analysis check box 508 for specifying whether to execute shape analysis and a composition analysis check box 509 for specifying whether to execute composition analysis.

The condition selection interface includes, regarding the shape analysis, a magnification selection portion 510 for specifying a magnification, a scan type selection portion 511 for specifying a type of scan, an image size selection portion 512 for specifying an image size, a detector selection portion 513 for specifying a detector, and a WD selection portion 514 for specifying a working distance.

The condition selection interface includes, regarding the composition analysis, a detector selection portion 515 for specifying a detector and a WD selection portion 516 for specifying a working distance.

Here, a user of the charged particle beam device 100 can improve processing efficiency by appropriately designating different conditions for the search condition and the analysis condition. For example, consider a case where 60 fields of view are required to cover the entire sample S, and scanning at a scan speed of 40 seconds per field of view is required. As an example of a case where the sample S is analyzed using only a single condition (analysis condition), time of 40 [seconds]×60[fields of view]=2400 [seconds]=40 [minutes] is required.

Meanwhile, as pre-processing of the analysis, search processing for specifying a region requiring strict analysis can be performed. Since this search does not require as strict scanning as the analysis, a condition that allows processing at a higher speed can be used. For example, if the scan speed is set to 1 second per field of view and the magnification is set to ⅕ of that in the analysis condition (for example, if the magnification in the analysis condition is 1500 times, the magnification in the search condition is set to 300 times), time required for the search is 1 [second]×60 [fields of view]/5=12 [seconds]. As a result of this search, when the analysis is required for three regions, time required for the analysis is 40 [seconds]×3 [fields of view]=120 [seconds], and the search and the analysis can be completed in 132 [seconds] in total, that is, 2 minutes and 12 seconds.

This method of determining the search condition and the analysis condition is an example. Depending on an application of the charged particle beam device 100, it may be unnecessary to complete the search at a higher speed than the analysis, or it may be unnecessary to improve the processing efficiency.

Returning to FIG. 5, the digitization item is a condition defining an operation of the control unit 151 serving as the evaluation unit, that is, the digitization item can be referred to as an evaluation condition. The condition selection interface includes, regarding a digitization item related to the shape analysis, a diameter check box 517 for specifying whether to output a diameter of an object of interest, an area check box 518 for specifying whether to output an area of the object of interest, and a script field 519 (or a plurality of script fields) for specifying a program to be used in association with the evaluation.

A meaning of the "object of interest" can be appropriately interpreted by a person skilled in the art, and refers to, for example, a particle or a foreign matter. The object of interest is not limited to an object separated from the sample, and may be a portion having a shape, a structure, or a composition distinguishable from others in the sample S.

The condition selection interface includes, regarding a digitization item related to the composition analysis, a content check box 520 for specifying whether to output a content of a specific component in the object of interest, and a crystal orientation ID check box 521 for specifying whether to output a crystal orientation ID of the object of interest.

The condition selection interface includes a "SAVE" button 522. In response to an operation on the "SAVE" button 522, the charged particle beam device 100 associates the conditions, which are specified on the condition selection interface at the instant of time of the operation, with each other to form a condition set, and stores the condition set in the storage unit 153. At this time, an input of information for specifying the condition set (for example, a name displayed in the name field 301 of FIG. 3) may be accepted, and the information may be stored in the storage unit 153 in association with the condition set.

The condition set may include an end condition. In the example of FIG. 5, the condition selection interface includes an end condition selection portion 523 for specifying an end condition. The end condition may constitute a part of the search condition. The end condition may represent a condition for terminating the search processing before all the search regions are searched. For example, the search processing may be terminated when a predetermined number or more of specific objects of interest are detected during the search processing. By using such an end condition, it is possible to make the operation of the charged particle beam device 100 conform to various criteria, such as performing, in accordance with a monitoring manual of asbestos inspection, the composition analysis on a specific object of interest that is detected for a predetermined number or more. When the search processing is terminated, execution of processing (to be described later) after step 205 in FIG. 2 may be omitted.

Such creation and change of the condition set may be performed before the processing of FIG. 2 is started, or may be performed in step 201 of FIG. 2 as described above. In any case, in step 201, the display unit 154 outputs the condition selection interface, and the charged particle beam device 100 accepts a selection of the condition set via the condition selection interface.

As described above, in the present embodiment, the condition set includes the following information.

Information for specifying one learned model from a plurality of learned models.

Information for specifying one search condition from a plurality of search conditions that define an operation of at least one of the irradiation unit 110 and the detection unit 130. With this information, a search condition suitable for each learned model can be used.

Information for specifying one analysis condition from a plurality of analysis conditions that define an operation of at least one of the irradiation unit 110 and the detection unit 130. With this information, an analysis condition suitable for each learned model can be used.

In the present embodiment, the condition set further includes the following information.

Information for specifying one evaluation condition from a plurality of evaluation conditions that define an operation of the evaluation unit (control unit 151). With this information, an evaluation condition suitable for each learned model can be used.

Therefore, the user of the charged particle beam device 100 can determine all of the learned model, the search condition, and the analysis condition only by selecting one condition set. Therefore, time and labor required for individually determining these conditions are saved.

After step 201 is executed in this manner, the charged particle beam device 100 designates the search region 306 as the search range (step 202). The charged particle beam device 100 may automatically determine the search region 306 or may determine the search region 306 in accordance with an input from the user.

An automatic determination can be performed by, for example, image processing. For example, the sample stage 307 may be detected by detecting a disk-shaped region in the navigation image 305. In the example of FIG. 1, the navigation image photographing device 160 (optical camera) performs photographing to obtain the navigation image 305. Therefore, a portion including a color different from a surrounding color (that is, a color considered to be a color of the sample stage 307 itself) on the sample stage 307 may be determined as the search region 306. A determination of whether two colors are different may be performed based on, for example, whether the two colors are on different sides with respect to an identification line in a color space. The search region 306 may be determined based on other signals such as light and darkness of a specific region in the image, instead of a color. Non-use of color-related information is suitable for a case where the navigation image 305 is a monochrome image (a case where the navigation image photographing device 160 is a monochrome camera or the like, or a case where an image such as an SEM image is used as the navigation image 305). Further, the charged particle beam device 100 may determine or change the search region 306 in accordance with an operation performed on the condition selection interface (for example, an operation using a mouse pointer).

Next, the charged particle beam device 100 searches for a structure of interest (step 203). That is, based on the search condition specified in step 201, the search region 306 (a first region) of the sample S is irradiated with the charged particle beam via the irradiation unit 110, and a signal (a first signal) caused by the irradiation is detected via the detection unit 130. In this search, for example, photographing by low-magnification and high-speed scanning can be used. This step 203 may be started, for example, when a "START" button 309 in FIG. 3 is operated.

The "structure of interest" means, for example, a candidate of the object of interest. The first signal may be, for example, a signal based on electrons generated when the sample S is irradiated with the charged particle beam, or a signal based on X-rays generated when the sample S is irradiated with the charged particle beam.

Next, the charged particle beam device 100 detects the structure of interest using a learned model (step 204). For example, first, information based on the signal (the first signal) detected in step 203 is transferred to the learned model specified in step 201. This information may be the first signal itself or may be appropriately converted or corrected. Then, information that indicates a region (a second region) of the sample S including a position of the candidate of the object of interest is acquired from the learned model. The second region is a part of the search region 306 and is a region smaller than the search region 306.

For example, when the learned model outputs a heat map indicating an existence probability of the object of interest for each pixel, the second region can be determined based on the heat map. Although specific processing for determining the second region based on the heat map is not particularly described, a person skilled in the art can appropriately design the processing based on a well-known technique. For example, the processing may include binarization processing using an appropriate threshold value.

Figure 6B:
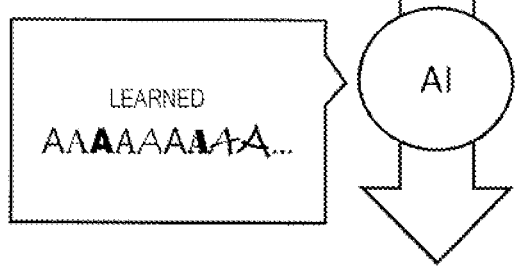
Figure 6C:
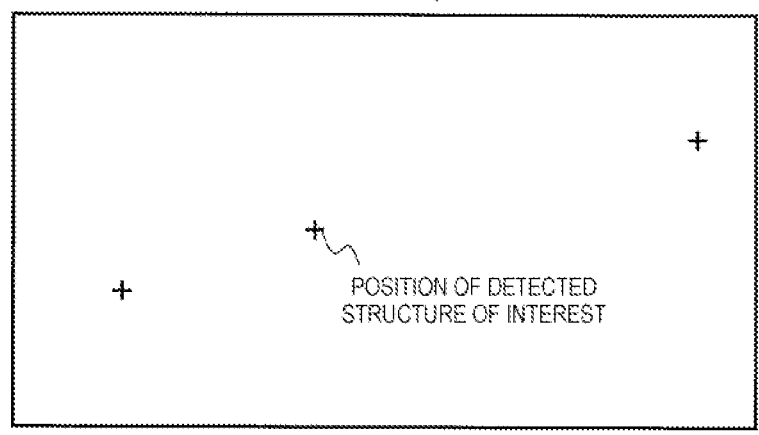

FIG. 6 shows an example of the second region. (a) of FIG. 6 shows fields of view 601 having 3 horizontal columns×2 vertical rows. Each field of view 601 has a region overlapping the adjacent field of view 601, that is, an overlap region 602 in a periphery thereof. On the conductive tape 308, there are the structure of interest (represented by a character "A") and other structures (represented by a character "B").

The learned model outputs information shown in (c) of FIG. 6 (for example, information can be expressed in a form of a set of coordinates) based on information shown in (a) of FIG. 6 (for example, information can be expressed in a form of an image). As shown in (b) of FIG. 6, the learned model learns various shapes and the like of the structure of interest (represented by characters "A" of various fonts), and can detect the structure of interest. Although a specific example of the learned model having such a function is not particularly shown, a person skilled in the art can generate the learned model using a well-known learning model and appropriate teaching data.

In an example of (c) of FIG. 6, the second region is represented by a position of the structure of interest (represented by a symbol of "+"). The second region may be, for example, the position (point) of the structure of interest, or may be a rectangular region having a predetermined two-dimensional dimension with the position of the structure of interest as a center. However, the second region is a part of the search region 306 (the first region), and is defined within a range that does not protrude from the search region 306.

After step 204, the charged particle beam device 100 may perform axis adjustment for achieving high resolution. When the charged particle beam device 100 is a scanning transmission electron microscope, orientation adjustment may be performed after step 204.

Next, the charged particle beam device 100 performs the shape analysis (step 205), the composition analysis (step 206), or both analyses based on the analysis condition. That is, based on the analysis condition specified in step 201, the second region is irradiated with the charged particle beam via the irradiation unit 110, and the second signal caused by the irradiation is detected via the detection unit 130. The second signal may be, for example, a signal based on the electrons generated when the sample S is irradiated with the charged particle beam, or a signal based on the X-rays generated when the sample S is irradiated with the charged particle beam. In particular, when the first signal (the signal used for the search) is a signal based on the electrons and the second signal (the signal used for the analysis) is a signal based on the X-rays, the search can be efficiently executed and the analysis can be executed with high accuracy.

FIG. 7 schematically shows processing related to the shape analysis in step 205. An analysis region 701 (the second region) is indicated by hatching. In this example, three analysis regions 701 including three structures of interest respectively are photographed with high resolution and high signal-to-noise ratio (high S/N ratio). For the shape analysis, for example, photographing by high-magnification and low-speed scanning can be used.

FIG. 8 schematically shows processing related to the composition analysis in step 206. An analysis region 801 (the second region) is a point corresponding to a position of the structure of interest. In this example, spectrum analysis using characteristic X-rays is performed for each of the analysis regions 801. For the composition analysis, for example, high-magnification photographing using energy dispersive X-ray spectroscopy (EDS) or electron backscatter diffraction (EBSD) can be used. For photographing, a charged particle beam with high acceleration or with a large current may be used.

Next, the charged particle beam device 100 digitizes an analysis result (step 207). That is, information based on the signal (the second signal) detected in step 205 or step 206 is input to the evaluation unit (control unit 151), and an evaluation result output from the evaluation unit is acquired. Here, the information based on the second signal may be the second signal itself, or may be appropriately converted or corrected.

In step 207, the evaluation unit executes an evaluation on the object of interest, but a description of specific processing content of the evaluation is omitted. The specific processing content can be appropriately designed by a person skilled in the art based on a well-known technique or the like. For example, when an image is acquired as a result of the shape analysis in step 205, a diameter, an area, or the like of the candidate of the object of interest can be evaluated by well-known image processing, signal processing, or the like.

Figure 9A:
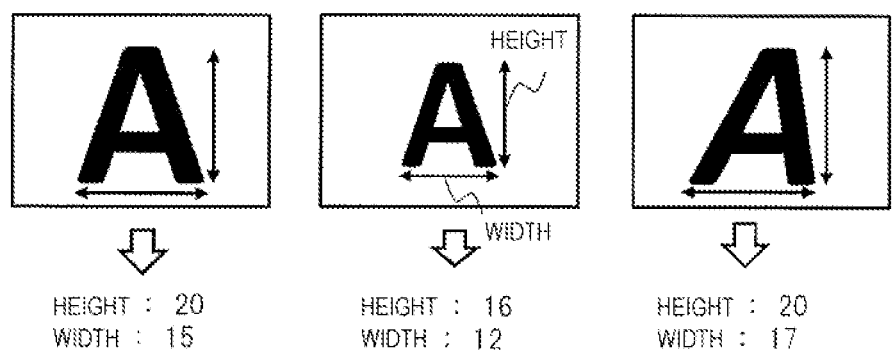
FIGS. 9A and 9B are examples of an evaluation result.
Figure 9B:
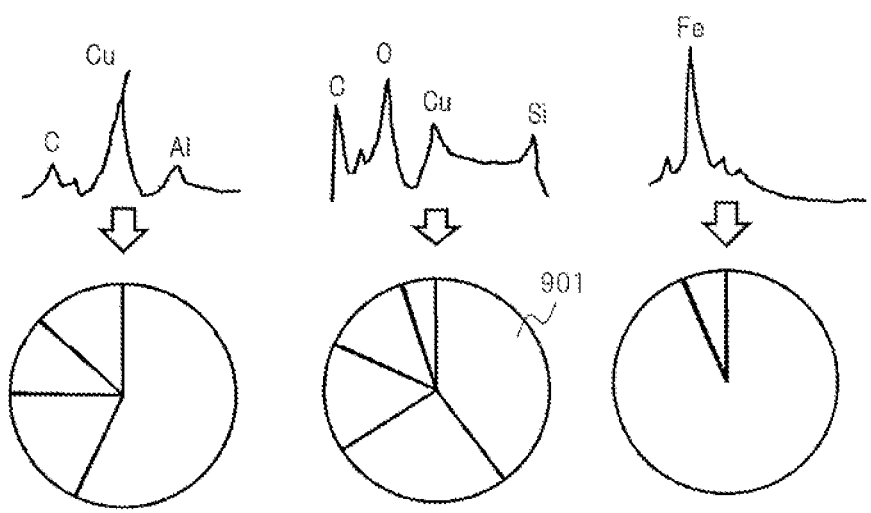

FIG. 9 shows an example of the evaluation result. (a) of FIG. 9 corresponds to the shape analysis in step 205. A height and a width of the analyzed structure of interest are shown as an evaluation result. (b) of FIG. 9 corresponds to the composition analysis in step 206. A composition of the analyzed structure of interest is shown as an evaluation result. In (b) of FIG. 9, the composition is schematically shown as a pie chart representing a ratio of each element.

Next, the charged particle beam device 100 displays the evaluation result. The display may be performed in a table format (step 208), may be performed in a form of being superimposed on an image photographed by the charged particle beam device 100 (step 209), or may be performed as a combination thereof.

Next, the charged particle beam device 100 outputs data representing the evaluation result (step 210). For example, the data may be in a format that can be processed by another application program. The data may include position information for re-photographing, information for increasing accuracy of the image processing, information for calculating statistical data, and the like.

Figure 10:
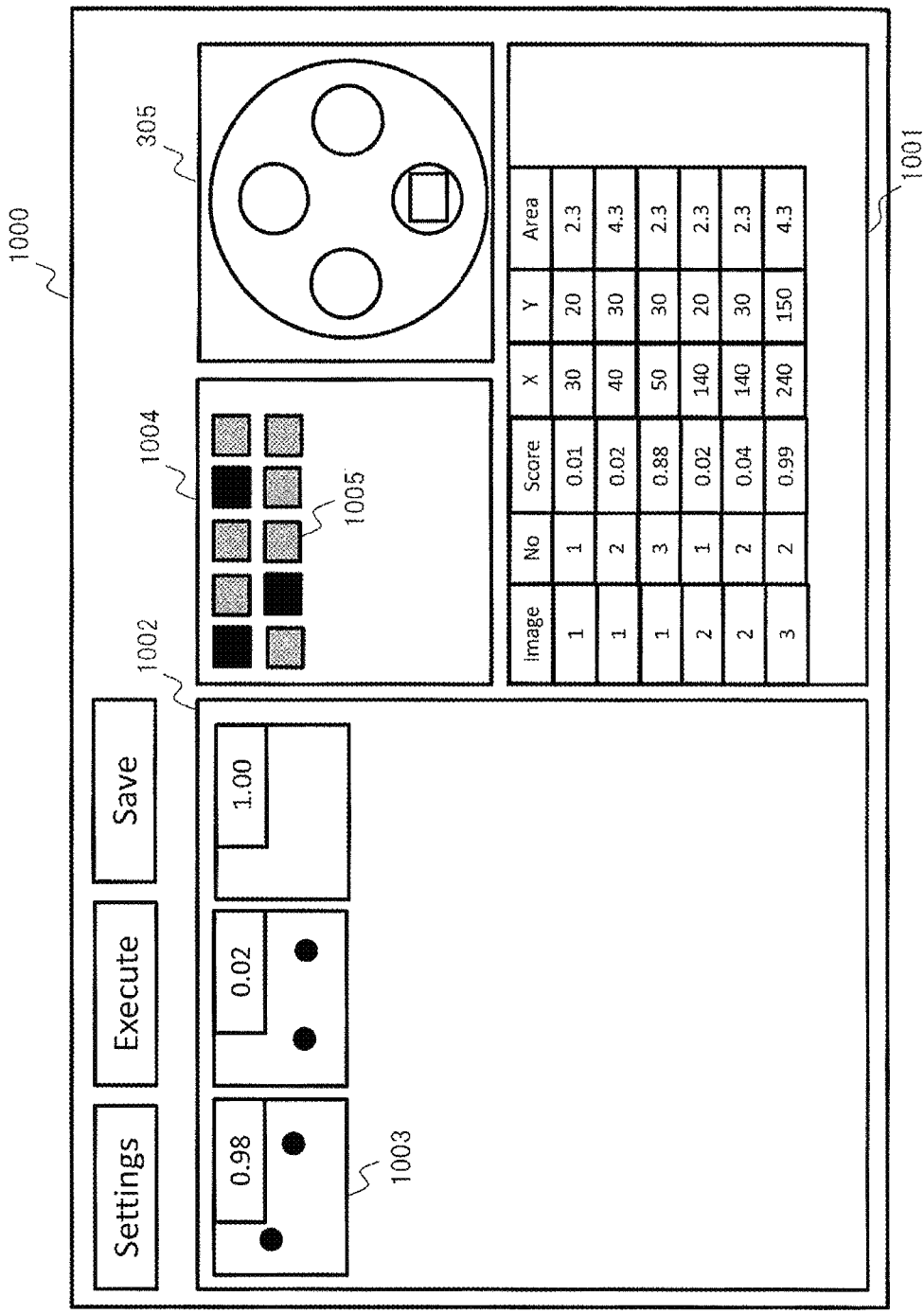
FIG. 10 is a display example of the evaluation result.

FIG. 10 shows a display example of the evaluation result. Such a display can be realized as a screen 1000 displayed on the display unit 154. The screen 1000 may constitute a part of the condition selection interface. The screen 1000 includes a table format portion 1001 and a superimposing portion 1002.

In the table format portion 1001, the evaluation result is displayed in a table format. In an example of FIG. 10, for each structure of interest, an image number ("Image") corresponding to an analysis region including the structure of interest, a number ("No") specifying the structure of interest among structures of interest included in the analysis region, an evaluation result ("Score") regarding the structure of interest, a position ("X" and "Y") of the structure of interest, and an area ("Area") of the structure of interest are displayed.

In the superimposing portion 1002, the evaluation result is displayed in a manner of being superimposed on an image. In this example, a plurality of result images 1003 representing evaluation results are displayed in the superimposing portion 1002, and the position of the structure of interest is indicated by a black circle superimposed on each result image 1003. For each result image 1003, the evaluation result regarding the structure of interest included in the image is displayed as a numerical value. Although content of the result image 1003 is not particularly illustrated, for example, an image acquired by analysis processing is displayed.

Although only the position of the structure of interest is indicated by the black circle in this example, when the structure of interest has a shape, the shape may be displayed in a manner of being superimposed on the result image 1003. For example, a color of a pixel constituting the structure of interest may be changed to a specific color (for example, red or green).

The screen 1000 may include a map portion 1004. A symbol 1005 corresponding to each result image 1003 is displayed in the map portion 1004. A display mode of the symbol 1005 changes according to information related to the corresponding result image 1003. The change in the display mode includes changes in shape, color, color tone, shading, size, position, and the like.

For example, a shape (rectangle in this example) of the symbol 1005 may be determined according to a shape of the result image 1003, and may be the same as the shape of the result image 1003, for example. A color or shading of the symbol 1005 may be determined according to the evaluation result regarding the structure of interest included in the result image 1003. A size of the symbol 1005 may be determined according to a size of the result image 1003 of the sample S. For example, relative sizes between the symbols 1005 may be determined according to relative sizes between the result images 1003. A position of the symbol 1005 in the map portion 1004 may correspond to a position of the result image 1003 in the sample S.

The screen 1000 may include the navigation image 305.

As described above, according to the charged particle beam device 100 according to the present embodiment, the search condition and the analysis condition are automatically determined only by selecting the condition set related to the operation of the charged particle beam device. Since the learned model used for the search is also determined at this time, the analysis region is automatically determined using this model. Accordingly, manual work is omitted, and time and labor are saved.

Next, the "SEARCH CONDITION ADJUSTMENT" button 507 in FIG. 5 will be described. The charged particle beam device 100 may automatically adjust the search condition when the "SEARCH CONDITION ADJUSTMENT" button 507 is operated. Such automatic adjustment of the search condition can be used, for example, to optimize a search condition, which is set in consideration of a specific charged particle beam device and a specific object of interest, with respect to another charged particle beam device or another object of interest.

Figure 11:
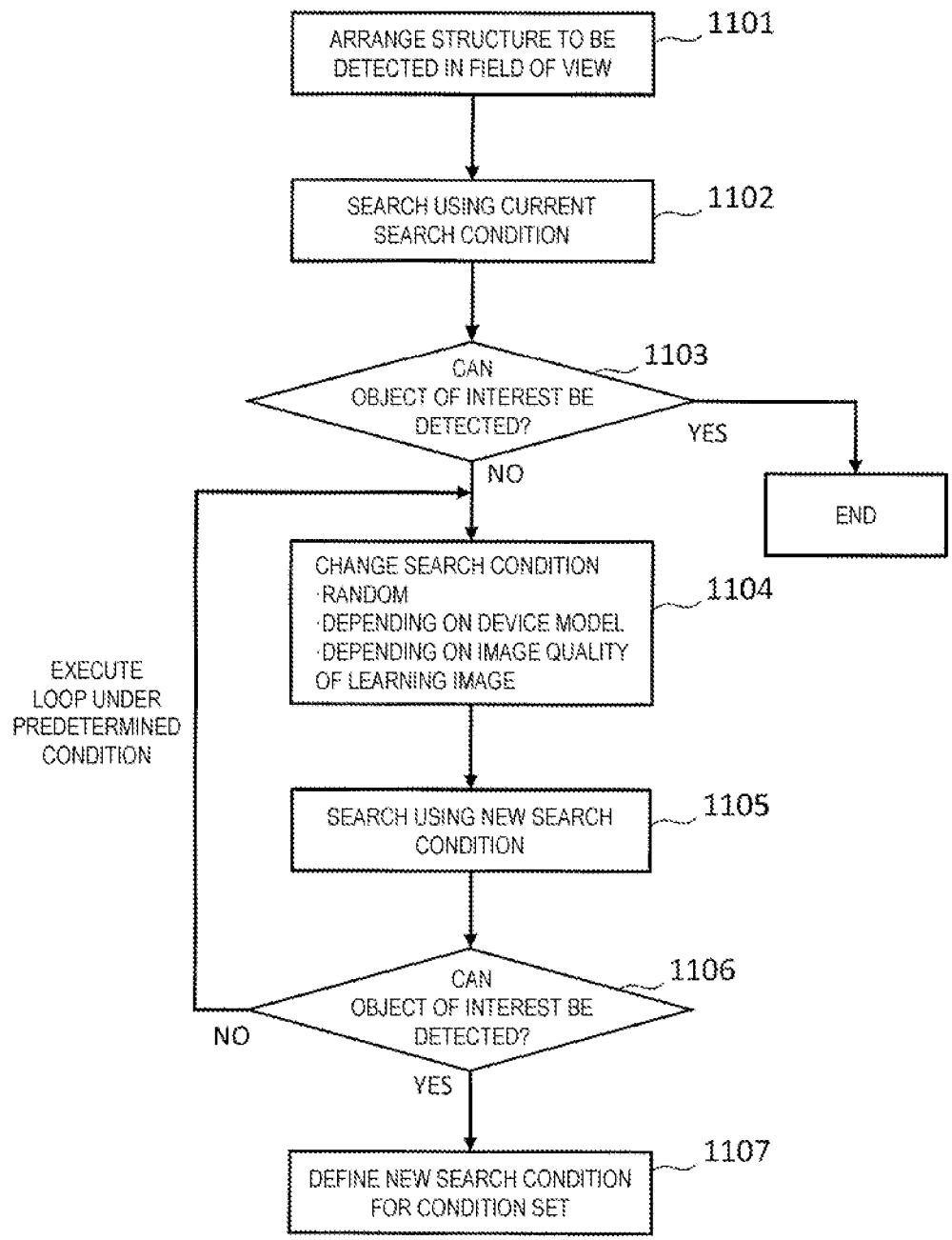
FIG. 11 is a flowchart showing an operation of the charged particle beam device related to automatic adjustment of a search condition.

FIG. 11 is a flowchart showing an operation of the charged particle beam device 100 related to the automatic adjustment of the search condition. In processing of FIG. 11, first, the charged particle beam device 100 arranges an object of interest to be detected, in a field of view of photographing (step 1101). The arrangement may be manually performed by the user of the charged particle beam device 100.

Next, the charged particle beam device 100 performs the search using a search condition (a first search condition) included in a currently designated condition set (step 1102). For example, steps 203 and 204 in FIG. 2 are executed based on the first search condition, and information that represents the analysis region (the second region) is acquired.

Next, the charged particle beam device 100 determines whether the object of interest (or an appropriate structure of interest) can be appropriately detected (step 1103). Specific content of this determination can be appropriately designed by a person skilled in the art as a condition related to information that represents a detected analysis region. As an example, when the number of detected analysis regions is equal to or greater than a predetermined threshold value, it is determined that the object of interest can be appropriately detected, and when the number of detected analysis regions is less than the predetermined threshold value, it is determined that the object of interest cannot be appropriately detected.

When the object of interest can be appropriately detected (for example, when the information that represents the analysis region satisfies a predetermined condition), the charged particle beam device 100 ends the processing. In this case, the current condition set is not changed.

On the other hand, when the object of interest cannot be appropriately detected (for example, when the information that represents the analysis region does not satisfy the predetermined condition), the charged particle beam device 100 changes the search condition (step 1104). When the search condition includes a combination of a plurality of conditions as in the present embodiment, at least a part of the search condition is changed. Here, the change of the search condition may be performed at random, may be performed according to a model of the charged particle beam device 100, or may be performed according to image quality of the image (for example, the image acquired in step 203) used for the search. In this way, a new search condition (a second search condition) is generated.

Next, the charged particle beam device 100 performs a search using the second search condition (step 1105). For example, steps 203 and 204 in FIG. 2 are executed based on the second search condition, and information that represents the analysis region (the second region) is acquired.

Next, similar to step 1103, the charged particle beam device 100 determines whether the object of interest (or an appropriate structure of interest) can be appropriately detected (step 1106).

When the object of interest can be appropriately detected (for example, when the information that represents the analysis region satisfies the predetermined condition), the charged particle beam device 100 stores the second search condition as a part of the condition set (step 1107). For example, the search condition of the condition set selected so far is changed so as to match the second search condition. A new condition set generated in this manner may be stored by overwriting the condition set before the change, or may be stored as a condition set different from the condition set before the change.

On the other hand, when the object of interest cannot be appropriately detected, the charged particle beam device 100 returns the processing to step 1104 and executes a loop including steps 1104 to 1106 according to a predetermined condition. The predetermined condition may be set to be, for example, that the number of times of execution of the loop is equal to or less than a predetermined threshold value. When the predetermined condition is not satisfied (for example, when the loop is executed many times and the number of times of execution is greater than the threshold value as a result), the charged particle beam device 100 ends the processing in FIG. 11. In this case, the current condition set is not changed.

According to such automatic adjustment of the search condition, a search condition that is not necessarily optimized for a specific charged particle beam device or a specific object of interest can be more appropriately optimized. For example, it is possible to generate a search condition for a certain object of interest based on a search condition for another certain object of interest without changing the charged particle beam device. Accordingly, it is possible to save time and labor of setting a specific search condition for each object of interest while utilizing one charged particle beam device.

Even when detecting the same object of interest by using the same charged particle beam device, performance may change due to maintenance or the like of the charged particle beam device, and may not match the search condition. Even in such a case, the search condition can be optimized again by performing the automatic adjustment of the search condition.

In the first embodiment, the following modifications can be applied. In the first embodiment, a single learned model is used in the search processing in steps 201 to 204. As a modification, the search processing may be performed using a plurality of learned models. For example, a plurality of condition sets may be selected, and the search may be performed using a learned model specified for each condition set. In this case, a method of advancing the analysis processing can be designed as appropriate. For example, analysis regions may be determined based on search results of the learned models, and the analysis processing may be performed for all of the analysis regions under corresponding analysis conditions. Alternatively, the plurality of search results from the plurality of learned models may be combined, and the analysis processing may be performed for an integrated analysis region by using a single analysis condition. A method of determining the analysis condition in this case can be designed as appropriate.

Figure 12:
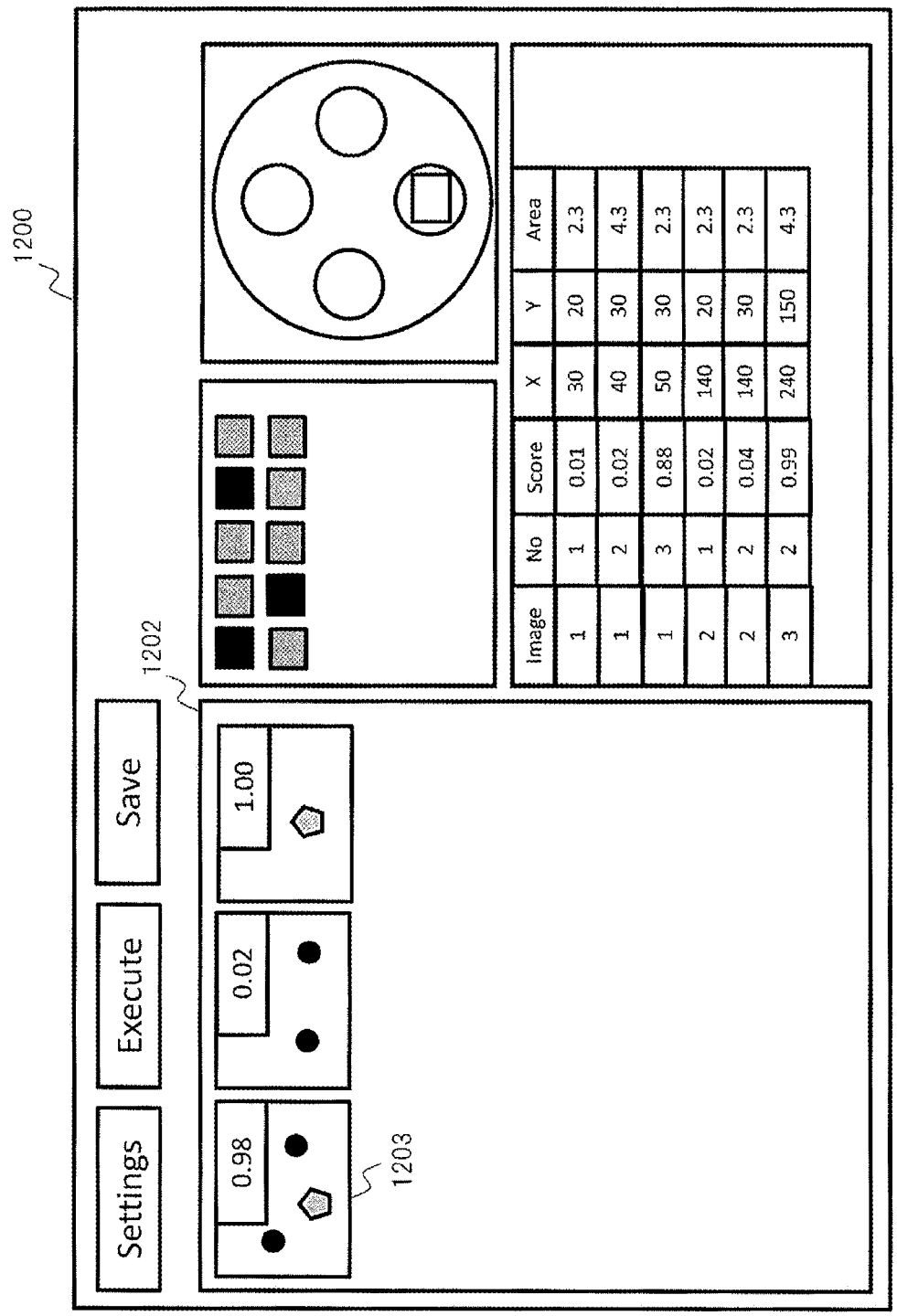
FIG. 12 is a display example of an evaluation result according to a modification.

FIG. 12 is a display example of an evaluation result according to such a modification. In a screen 1200 in this example, in a result image 1203 displayed in a superimposing portion 1202, positions of structures of interest detected by different learned models are displayed in different modes. For example, a position of a structure of interest detected by a first learned model is indicated by a black circle, and a position of a structure of interest detected by a second learned model is indicated by a gray pentagon.

A variation in the display mode for representing a position of a structure of interest can be freely designed. For example, a different shape may be used according to the learned model, a different color or color tone may be used according to the learned model, a different filling pattern (vertical stripes, horizontal stripes, oblique stripes, gradation, or the like) may be used according to the learned model, whether to perform blinking display may be made different according to the learned model, or a plurality of these modes may be combined.

Although each of the search condition and the analysis condition includes a plurality of items in the first embodiment, the number and content of the items in each of the search condition and the analysis condition can be freely changed. For example, the search condition and the analysis condition may respectively include a single item.

DESCRIPTION OF REFERENCE NUMERALS

100 charged particle beam device
110 irradiation unit
111 electron source
112 lens barrel
120 sample chamber
130 detection unit (130A: first detection unit, 130B: second detection unit)
140 stage
141 sample holder
151 control unit (evaluation unit)
152 input unit
153 storage unit
154 display unit (interface output unit)
160 navigation image photographing device
201, 202, 203, 204, 205, 206, 207, 208, 209, 210 step
300 screen (condition selection interface)
500 screen (condition selection interface)
601 field of view
602 overlap region
701, 801 analysis region
1000 screen (condition selection interface)
1101, 1102, 1103, 1104, 1105, 1106, 1107 step
1200 screen (condition selection interface)

The invention claimed is:

1. A charged particle beam device, comprising:
an irradiation unit configured to irradiate a sample with a charged particle beam;
a detection unit configured to output a signal caused by irradiating the sample with the charged particle beam;
an interface output unit configured to output a condition selection interface for selecting one condition set from a plurality of condition sets; and
an evaluation unit configured to execute an evaluation on an object of interest, wherein
the condition set includes
information for specifying one learned model from a plurality of learned models,
information for specifying one search condition from a plurality of search conditions including at least one of an irradiation condition and a detection condition, and
information for specifying one analysis condition from a plurality of analysis conditions defining an operation of at least one of the irradiation unit and the detection unit,
the charged particle beam device is configured to
accept a selection of the condition set via the condition selection interface, irradiate a first region of the sample with the charged particle beam based on the specified search condition and detect a first signal caused by the irradiation, transfer information that is based on the first signal to the specified learned model, acquire information that represents a second region of the sample including a position of a candidate of the object of interest from the specified learned model, the second region being a part of the first region and smaller than the first region, irradiate the second region with the charged particle beam based on the specified analysis condition and detect a second signal caused by the irradiation, and input information that is based on the second signal to the evaluation unit, and the charged particle beam device is configured to acquire information that represents the second region based on a first search condition, acquire information that represents the second region based on a second search condition obtained by changing at least a part of the first search condition, when the information that represents the second region according to the first search condition does not satisfy a predetermined condition, and store the second search condition as a part of the condition set when the information that represents the second region according to the second search condition satisfies the predetermined condition.

2. The charged particle beam device according to claim 1, wherein the first signal is a signal based on electrons generated when the sample is irradiated with the charged particle beam, and the second signal is a signal based on X-rays generated when the sample is irradiated with the charged particle beam.

3. The charged particle beam device according to claim 1, wherein the condition set further includes information for specifying one evaluation condition from a plurality of evaluation conditions defining an operation of the evaluation unit.

* * * * *